United States Patent
Liang et al.

(10) Patent No.: US 8,781,783 B2
(45) Date of Patent: Jul. 15, 2014

(54) SYSTEM AND METHOD FOR CHECKING GROUND VIAS OF A CONTROLLER CHIP OF A PRINTED CIRCUIT BOARD

(75) Inventors: Hsien-Chuan Liang, Taipei Hsien (TW); Shen-Chun Li, Taipei Hsien (TW); Chun-Jen Chen, Taipei Hsien (TW); Shou-Kuo Hsu, Taipei Hsien (TW); Yung-Chieh Chen, Taipei Hsien (TW); Wen-Laing Tseng, Taipei Hsien (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 956 days.

(21) Appl. No.: 12/700,747

(22) Filed: Feb. 5, 2010

(65) Prior Publication Data

US 2011/0106481 A1    May 5, 2011

(30) Foreign Application Priority Data

Oct. 29, 2009    (CN) .......................... 2009 1 0309064

(51) Int. Cl.
    *G01R 31/00*    (2006.01)
(52) U.S. Cl.
    USPC ........... 702/117; 702/119; 702/123; 702/124; 702/59; 702/108; 702/118; 702/126; 702/182; 702/183; 702/185; 702/189; 702/152; 716/126; 716/136; 716/137; 716/138; 324/500; 324/512; 324/537; 324/750.01; 324/762.01; 324/763.01; 324/538; 324/73.1; 714/724; 714/742
(58) Field of Classification Search
    USPC ........... 702/117, 119, 123, 124, 59, 108, 118, 702/126, 182, 183, 185, 189, 152; 716/126, 716/136, 137, 138; 324/500, 512, 537, 324/750.01, 762.01, 763.01, 538, 73.1
    See application file for complete search history.

(56) References Cited

U.S. PATENT DOCUMENTS

| | | | | |
|---|---|---|---|---|
| 6,154,083 A * | 11/2000 | Gaudet et al. | ................. | 327/312 |
| 6,268,999 B1 * | 7/2001 | Tg | ............................ | 361/679.02 |
| 6,518,660 B2 * | 2/2003 | Kwon et al. | ................... | 257/704 |
| 7,281,232 B1 * | 10/2007 | Nicolino et al. | ............. | 716/112 |
| 7,301,525 B2 * | 11/2007 | Chang et al. | .................. | 345/156 |
| 7,472,367 B1 * | 12/2008 | Xie et al. | ....................... | 716/132 |
| 7,501,341 B1 * | 3/2009 | Von Herzen | ................. | 438/666 |
| 8,395,903 B1 * | 3/2013 | Wu et al. | ....................... | 361/777 |
| 2004/0015796 A1 * | 1/2004 | Frank et al. | ...................... | 716/5 |
| 2004/0267480 A1 * | 12/2004 | Day | .............................. | 702/117 |
| 2009/0172618 A1 * | 7/2009 | Fujimori et al. | .................. | 716/5 |

FOREIGN PATENT DOCUMENTS

| | | |
|---|---|---|
| TW | 200604865 | 2/2006 |
| TW | 200807200 | 2/2008 |

* cited by examiner

*Primary Examiner* — Jeffrey R West
*Assistant Examiner* — Hyun Park
(74) *Attorney, Agent, or Firm* — Novak Druce Connolly Bove + Quigg LLP

(57) ABSTRACT

A system and method for checking a ground via of control chips of a printed circuit board (PCB) provides a graphical user interface (GUI) displaying a layout of the PCB. The control chip has a plurality of ground pins. The computer searches for signal path routing of each ground pin and ground vias along each signal path routing of each ground pin. If there are any ground vias having the same absolute coordinates, the computer determines that the ground vias are shared by more than one ground pin.

15 Claims, 6 Drawing Sheets

SYSTEM AND METHOD FOR CHECKING GROUND VIAS OF A CONTROLLER CHIP OF A PRINTED CIRCUIT BOARD

CROSS REFERENCE TO RELATED APPLICATION

This application is related to China patent application 200910309064.90 (filed Oct. 29, 2009), the full disclosure of which is incorporated herein by reference.

BACKGROUND

1. Technical Field

Embodiments of the present disclosure relate to printed circuit board (PCB) inspection, and more particularly to a system and a method for checking ground vias of a controller chip of a PCB.

2. Description of Related Art

PCBs provide functional implementation of circuit design (i.e., the interconnection of electrical devices and components) for use in computer systems. In PCB design, both component placement (layout) and signal path routing need to be considered. Since more than one ground pin can occur along the signal path routings, if a plurality of ground pins share a signal ground via, ground bounce may result. Currently, a manual search of the signal path routing and ground vias is required, taking undue time and reducing efficiency.

What is needed, therefore, is an improved system and method for checking ground vias of a controller chip of the PCB.

DETAILED DESCRIPTION

The processes described may be embodied in, and fully automated via, functional modules executed by one or more general purpose processors. The functional modules may be stored in any type of computer-readable medium or other computer storage device. Some or all of the methods may alternatively be embodied in specialized computer hardware or communication apparatus.

Figure 1:
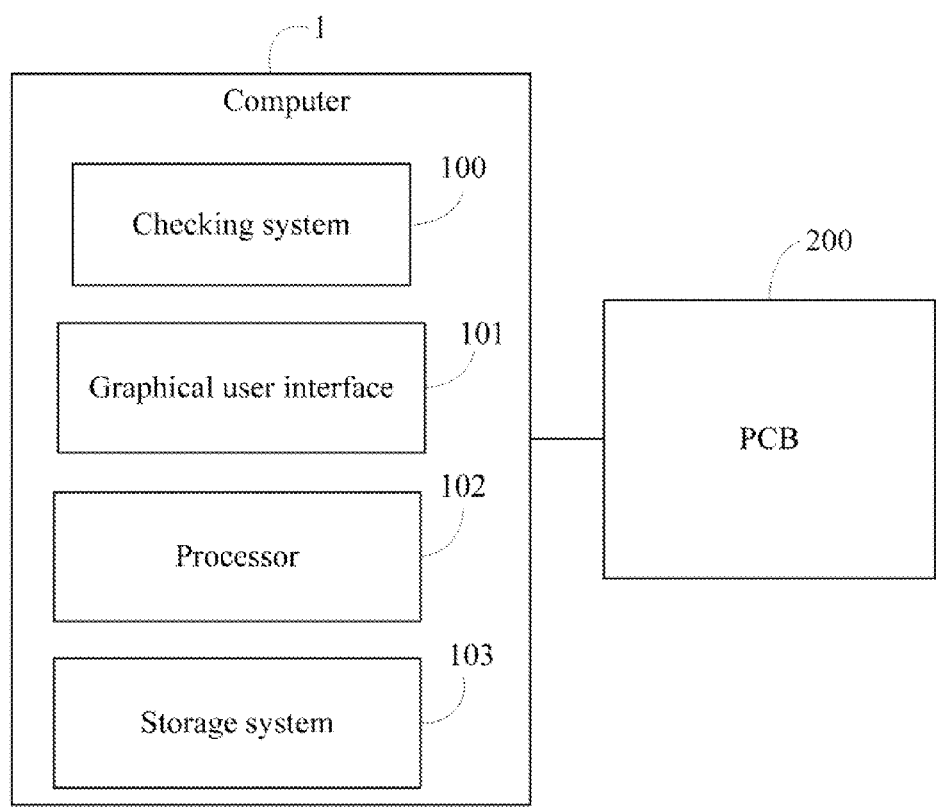
FIG. 1 is a block diagram of one embodiment of a computer comprising a checking system.
Figure 2:
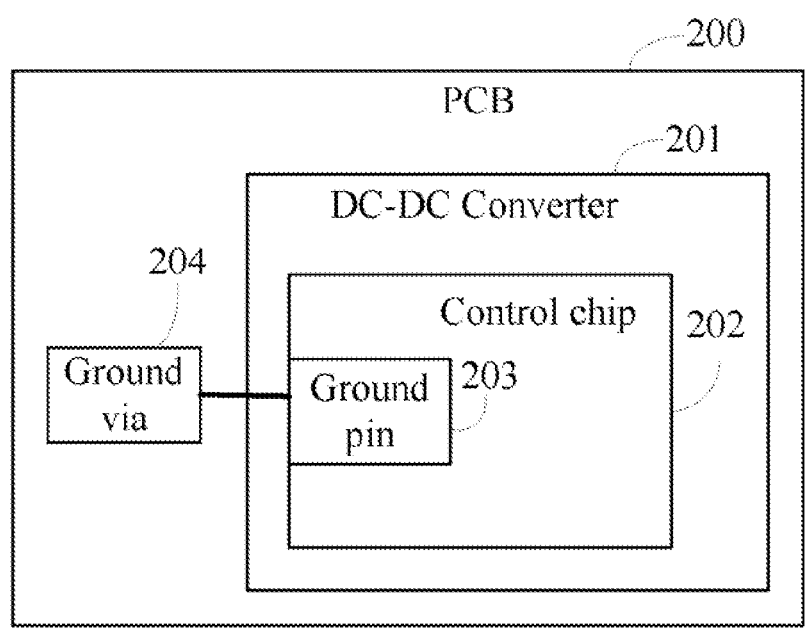
FIG. 2 is a schematic diagram of a printed circuit board (PCB).

FIG. 1 is a block diagram of one embodiment of a computer 1 comprising a check system 100. Also referring to FIG. 2, The check system 100 may check ground vias of a control chip 202 of a printed circuit board (PCB) 200 connected to the computer 1. The computer 1 provides a graphical user interface (GUI) 101 to display a layout of the PCB 200. The PCB 200 includes direct current to direct current converters (DC-DC converters) 201 (only one is shown in FIG. 2). Each of the plurality of DC-DC converters 201 includes a plurality of control chips 202 (only one is shown in FIG. 2). Each of the plurality of control chips 202 includes a plurality of ground pins 203. Each ground pin is connected to ground through a ground via 204. The ground via 204 may be embedded in the PCB 200.

The computer 1 includes a processor 102 and a storage system 103. The processor 102 executes one or more computerized operations of the computer 1 and other applications, providing function. The storage system 103 stores one or more programs, such as those of an operating system, other applications, and various data. In one embodiment, the storage system 103 stores signal path routings of each ground pin 203.

The storage system 103 also stores absolute coordinates of all the ground vias 204 on the PCB 200 in an absolute coordinate system and control chip information of each control chip 202. The control chip information may include, but is not limited to, absolute coordinates of a center point of the control chip 202 in the absolute coordinate system and relative coordinates of each ground pin 203 in a relative system. In one embodiment, the origin of the absolute coordinate may be the left lower corner of the PCB 200, and the origin of the relative coordinate may be the center point of the control chip 202.

Figure 3:
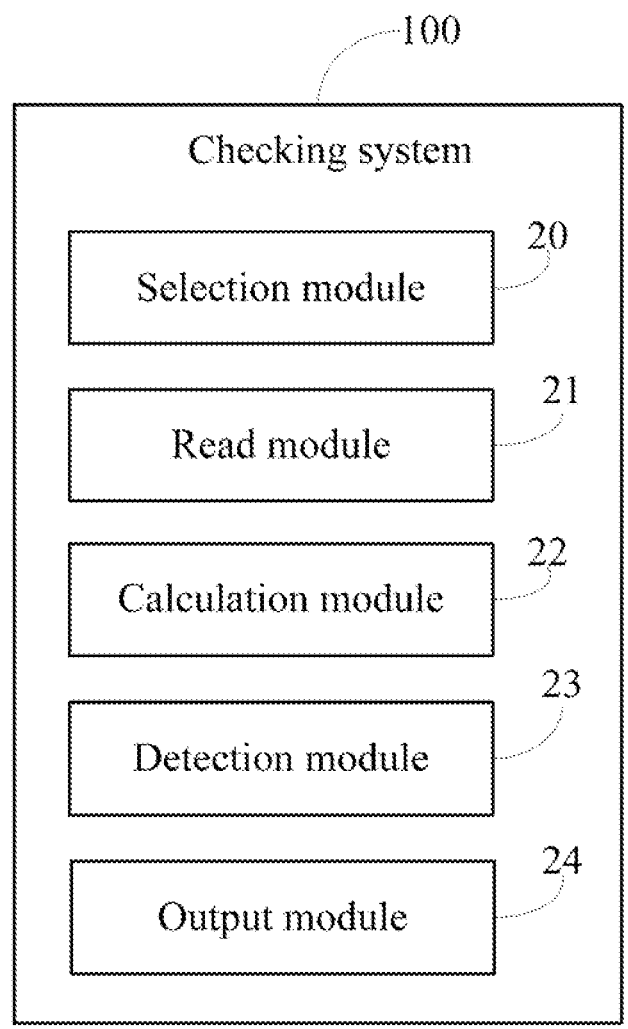
FIG. 3 is a block diagram showing functional modules of the checking system of FIG. 1.

FIG. 3 is a block diagram of functional modules of the checking system 100 in FIG. 1. In one embodiment, the checking system 100 may include a selection module 20, a read module 21, a calculation module 22, a detection module 23, and an output module 24. It may be understood that the processor 102 may be used to execute one or more computerized codes of the functional modules 20-24. The one or more computerized codes of the functional modules 20-24 may be stored in the storage system 103.

The selection module 20 selects a control chip 202 of the PCB 200.

The read module 21 reads the absolute coordinates of the center point of the control chip 202 and the relative coordinates of all the ground pins 203 of the control chip 202 from the storage system 103.

Figure 6:
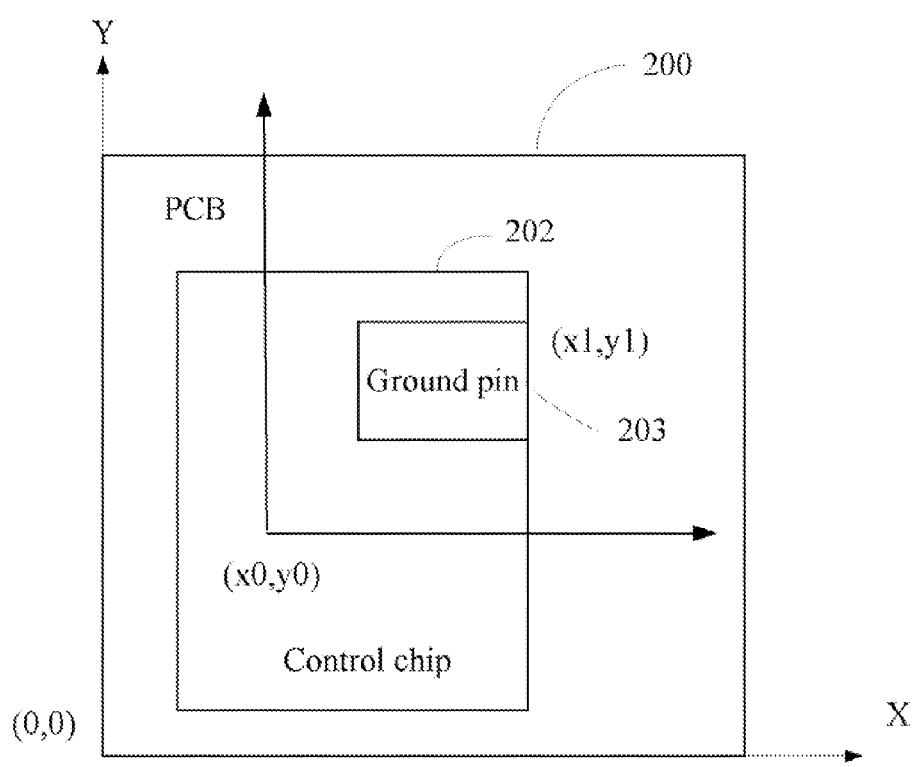
FIG. 6 is a schematic diagram illustrating calculation of coordinates of ground vias.

The calculation module 22 calculates absolute coordinates of each ground pin 203 according to the absolute coordinates of the center point of the control chip 202 and the relative coordinates of each ground pin 203. For example, as shown in FIG. 6, the absolute coordinates of the center point of the control chip 202 are (x0, y0). The relative coordinates of a ground pin 203 are (x1, y1). The calculation module 22 calculates the absolute coordinates of the ground pin 203 as (x0+x1, y0+y1).

The read module 21 searches for a signal path routing of each ground pin 203 according to the absolute coordinates thereof. The read module 21 also searches for the ground vias 204 along each signal path routing of each ground pin 203, and reads absolute coordinates of the ground vias 204 from the storage system 103.

Figure 5:
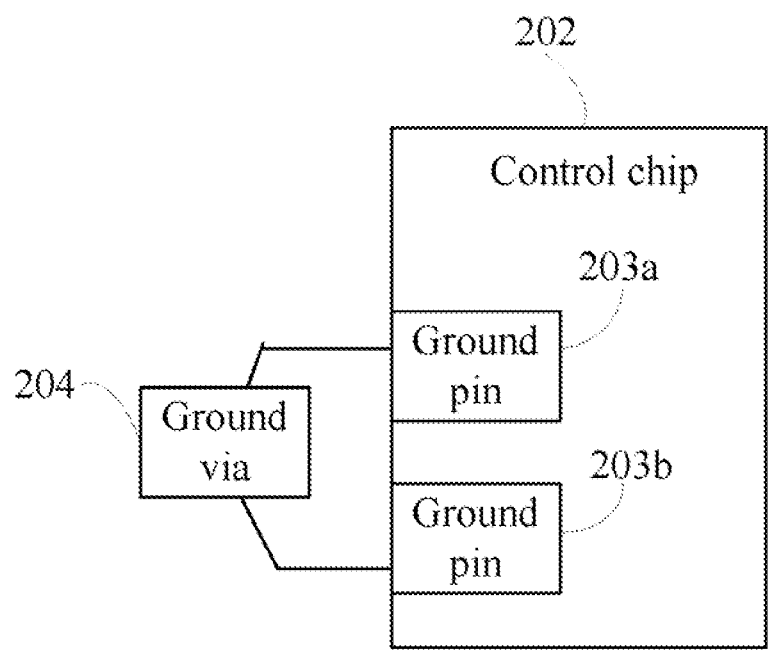
FIG. 5 is a schematic diagram illustrating ground vias of a control chip.

The detection module 23 determines whether there are any ground vias 204 having the same absolute coordinates. If there are more than one ground vias 204 having the same absolute coordinates, the detection module 23 determines that the ground vias 204 are shared by more than one ground pin 203. For example, as shown in FIG. 5, two ground pins 203a and 203b have a signal path routing respectively. There are a plurality of ground vias 204 (only one shown) along each signal path routing. The detection module 23 determines that absolute coordinates of the ground via 204 along the signal path routing of the ground pin 203a is the same as absolute coordinates of a ground via 204 along the signal path routing of the ground pin 203b. Thus, the detection module 23 determines that the ground pins 203a and 203b share the ground via 204.

The output module 24 generates a checking report including the absolute coordinates of each of the ground vias 204 and use information of each of the ground vias 204. In one embodiment, the use information of each of the ground vias 204 may indicate if the ground via is shared by more than one ground pin 203.

Figure 4:
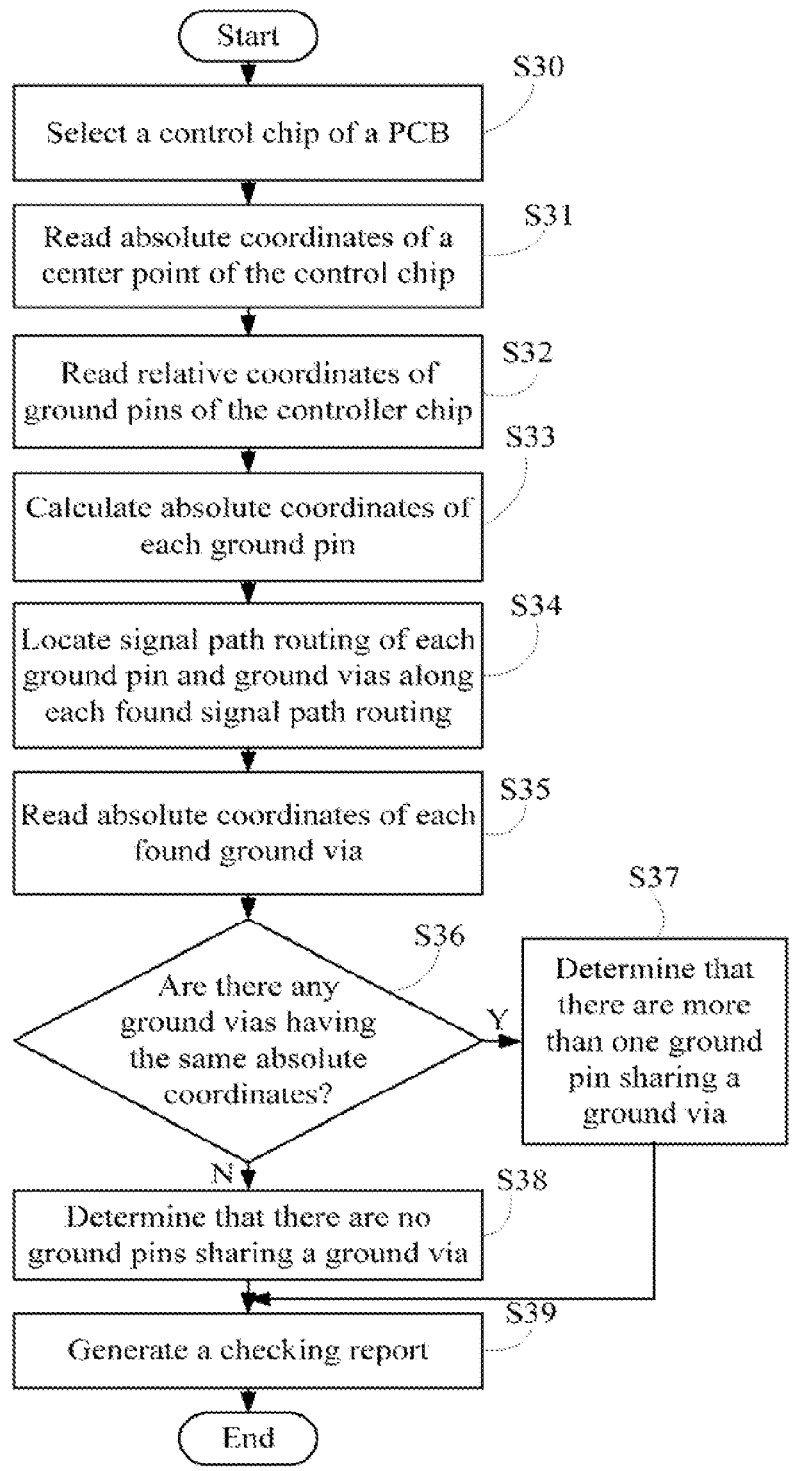
FIG. 4 is a flowchart of one embodiment of a method for checking ground vias of a controller chip of a printed circuit board.

FIG. 4 is a flowchart of one embodiment of a method for checking ground vias 204 of the controller chip 202 of the PCB 200.

In block S30, the selection module 20 selects a control chip 202 of the PCB 200.

In block S31, the read module 21 reads the absolute coordinates of the center point of the control chip 202 from the storage system 103.

In block S32, the read module 21 reads the relative coordinates of all the ground pins 203 of the control chip 202 from the storage system 103.

In block S33, the calculation module 22 calculates absolute coordinates of each ground pin 203 according to the absolute coordinates of the center point of the control chip 202 and the relative coordinates of each ground pin 203.

In block S34, the read module 21 searches for a signal path routing of each ground pin 203 according to the absolute coordinates of each ground pin 203. The ground vias 204 along each ground pin 203 are found by the read module 21.

In block S35, the read module 21 reads absolute coordinates of the ground vias 204 from the storage system 103.

In block S36, the detection module 23 determines whether there are any ground vias 204 having same absolute coordinates. If there are more than one ground vias 204 having the same absolute coordinates, block S37 is implemented. If there no ground vias 204 having the same absolute coordinates, block S38 is implemented.

In block S37, the detection module 23 determines that the ground vias are shared by more than one ground pin 203.

In block S38, the detection module 23 determines that there are no ground vias being shared.

In block S39, the output module 24 outputs a checking report. In one embodiment, the checking report may include the absolute coordinates of each of the ground vias 204 and use information. Use information of each of the ground vias 204 indicates whether the ground via is shared by more than one ground pin 203.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A system for checking ground vias of a controller chip of a printed circuit board (PCB), the system comprising:
   a storage system; and
   at least one processor executing one or more programs stored in the storage system, the one or more programs comprising:
   a read module operable to read absolute coordinates of a center point of the controller chip of the PCB in an absolute coordinate system, and relative coordinates of ground pins of the controller chip in a relative coordinate system;
   a calculation module operable to calculate absolute coordinates of each ground pin according to the absolute coordinates of the center point of the controller chip of the PCB and the relative coordinates of each ground pin;
   the read module further operable to search for a signal path routing of each ground pin according to the absolute coordinates of each ground pin, and find ground vias along each signal path routing, and read absolute coordinates of each found ground via from the storage system; and
   a detection module operable to determine that there are more than one ground pin sharing the same ground via when there are ground vias along a signal path routing of the ground pins having the same absolute coordinates, and determine that there are no ground pins sharing the same ground via when the absolute coordinates of the ground vias are different from each other.

2. The system of claim 1, wherein the one or more programs further comprise an output module operable to generate a checking report comprising the absolute coordinates of each of the found ground vias and use information of each of the found ground vias.

3. The system of claim 2, wherein the use information of each of the ground vias indicates whether the ground via is shared by more than one ground pin.

4. The system of claim 1, wherein an origin of the absolute coordinate system is a left lower corner of the PCB.

5. The system of claim 1, wherein an origin of the relative coordinate system is the center point of the controller chip.

6. A computer-based method for checking ground vias of a control chip of a printed circuit board (PCB), the method comprising:
   reading absolute coordinates of a center point of the control chip of the PCB in an absolute coordinate system, and reading relative coordinates of ground pins of the control chip in a relative coordinate system by a computer connected with the PCB;
   calculating absolute coordinates of each ground pin according to the absolute coordinates of the center point of the control chip of the PCB and the relative coordinates of each ground pin by the computer;
   searching for a signal path routing of each ground pin according to the absolute coordinates of each ground pin by the computer;
   finding ground vias along each signal path routing and reading absolute coordinates of each found ground via by the computer;
   determining that there is more than one ground pin sharing the same ground via when there are ground vias along signal path routing of the ground pins having same absolute coordinates; and
   determining that there are no ground pins sharing the same ground via by the computer when the absolute coordinates of the ground vias are different from each other.

7. The computer-based method of claim 6, further comprising:
   generating a checking report comprising the absolute coordinates of each of the ground vias and use information of each of the found ground vias.

8. The computer-based method of claim 7, wherein the use information of each of the ground vias indicates whether the ground via is shared by more than one ground pin.

9. The computer-based method of claim 6, wherein an origin of the absolute coordinate system is a left lower corner of the PCB.

10. The computer-based method of claim 6, wherein an origin of the relative coordinate system is the center point of the control chip.

11. A non-transitory computer readable medium having stored therein instructions that, when executed by a computer, cause the computer to perform a method for checking ground vias of a controller chip of a printed circuit board (PCB), the method comprising:

reading absolute coordinates of a center point of the controller chip of the PCB in an absolute coordinate system, and reading relative coordinates of ground pins of the controller chip in a relative coordinate system;

calculating absolute coordinates of each ground pin according to the absolute coordinates of the center point of the controller chip of the PCB and the relative coordinates of each ground pin;

searching for a signal path routing of each ground pin according to the absolute coordinates of each ground pin;

searching for ground vias along each signal path routing and reading absolute coordinates of each found ground via;

determining that there is more than one ground pin sharing the same ground via when there are ground vias along a signal path routing of the ground pins having the same absolute coordinates; and determining that there are no ground pins sharing the same ground via when the absolute coordinates of the ground vias are different from each other.

12. The non-transitory computer readable medium of claim 11, further comprising generating a checking report comprising the absolute coordinates of each of the ground vias and using information of each of the found ground vias.

13. The non-transitory computer readable medium of claim 12, wherein the use information of each of the ground vias indicates whether the ground via is shared by more than one ground pin.

14. The non-transitory computer readable medium of claim 11, wherein an origin of the absolute coordinate system is a left lower corner of the PCB.

15. The non-transitory computer readable medium of claim 11, wherein an origin of the relative coordinate system is the center point of the controller chip.

* * * * *